US00RE37961E

(19) United States
(12) Reissued Patent
Matsumura

(10) Patent Number: US RE37,961 E
(45) Date of Reissued Patent: Jan. 7, 2003

(54) PIN CONNECTOR, PIN CONNECTOR HOLDER AND PACKAGING BOARD FOR MOUNTING ELECTRONIC COMPONENT

(75) Inventor: Shigeru Matsumura, Tokyo (JP)

(73) Assignee: Advantest Corporation, Tokyo (JP)

(21) Appl. No.: 09/794,646

(22) Filed: Feb. 27, 2001

Related U.S. Patent Documents

Reissue of:
(64) Patent No.: 5,911,606
Issued: Jun. 15, 1999
Appl. No.: 08/807,830
Filed: Feb. 27, 1997

(30) Foreign Application Priority Data

Mar. 1, 1996 (JP) ..... 8-044839

(51) Int. Cl.[7] ..... H01R 11/22
(52) U.S. Cl. ..... 439/852
(58) Field of Search ..... 439/852, 853, 439/851, 628, 152, 44–46

(56) References Cited

U.S. PATENT DOCUMENTS 3,853,389 A * 12/1974 Occhipinti ..... 439/852
4,781,621 A * 11/1988 Sugiyama et al. ..... 439/76.2
4,892,492 A * 1/1990 Mueller ..... 439/852
5,038,467 A * 8/1991 Murphy ..... 439/852

* cited by examiner

*Primary Examiner*—Brian Sircus
*Assistant Examiner*—Chandrika Prasad
(74) *Attorney, Agent, or Firm*—Knobbe, Martens, Olson & Bear, LLP

(57) ABSTRACT

A pin connector has an outer contact bent outwardly from at least a portion of a side wall of a metallic slender sleeve and an inner contact bent inwardly from at least a portion of a side wall of the metallic slender sleeve. The outer contact and the inner contact are resilient radially of the metallic slender sleeve. An electronic component packaging board comprises a board having a through hole defined therein in alignment with an external lead of an electronic component, the pin connector being inserted and held in the through hold. The electronic component packaging board also has another board disposed on the reverse side of the board and having a through hole defined therein. An end portion of the pin connector projects from the through hole in the board and is soldered to the other board in the through hole thereof. A positioning structure such as a pin positions the pin connector inserted in the through hole in the board with respect to the through hole in the other board.

10 Claims, 4 Drawing Sheets

PIN CONNECTOR, PIN CONNECTOR HOLDER AND PACKAGING BOARD FOR MOUNTING ELECTRONIC COMPONENT

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a pin connector, a holder for holding such a pin connector, and an electronic component packaging board for mounting an electronic component thereon, and more particularly to the structure of an electronic component packaging board suitable for mounting thereon an electronic component such as a device socket by which a semiconductor device can detachably be supported.

2. Description of the Related Art

It has heretofore been well known in the art to mount a device socket by which a semiconductor device can detachably be supported, on a packaging board in a semiconductor device testing apparatus for measuring operating conditions of the semiconductor device support by the device socket.

FIG. 1 of the accompanying drawings shows a conventional electronic component packaging board for soldering an electronic component thereto. As shown in FIG. 1, a packaging board 1 has a plurality of through holes 4 for inserting therein external leads 3 of a device socket 2 as an electronic component. When the external leads 3 are inserted into the through holes 4 and soldered thereto, the device socket 2 is electrically connected to patterns on the packaging board 1. The device socket 2 supports a semiconductor device 5 thereon which has external leads electrically connected respectively to the external leads 3 by contact elements 6.

FIG. 2(a) of the accompanying drawings shows another conventional electronic component packaging board to which an electronic component is detachably attached. FIG. 2(b) of the accompanying drawings is an enlarged fragmentary cross-sectional view of a small-size socket on the conventional electronic component packaging board shown in FIG. 2(a), and FIG. 2(c) of the accompanying drawings is an enlarged fragmentary cross-sectional view of another small-size socket which may be used on the conventional electronic component packaging board. Although not shown in FIGS. 2(b) and 2(c), the conventional electronic component packaging board shown in FIG. 2(a) has a plurality of small-size sockets.

As shown in FIG. 2(a), an electronic component packaging board 7 has a plurality of through holes defined therein at positions in alignment with external leads 3 of a device socket 2, and a plurality of small-size sockets 8 inserted and secured in the respective through holes. The electronic component packaging board 7 allows the device socket 2 to be electrically connected to patterns on the electronic component packaging board 7 simply when the external leads 3 are inserted into the respective small-size sockets 8. The inserted external leads 3 can easily be pulled out of the respective small-size sockets 8.

As shown in FIG. 2(b), each of the small-size sockets 8 comprises a tubular sleeve 10 inserted in a through hole 9 defined in the electronic component packaging board 7 and a contact 11 mounted in the tubular sleeve 10 for exerting resilient forces radially of the tubular sleeve 10. As shown in FIG. 2(c), each of the small-size sockets 8 may comprise a tubular sleeve 10 having a tip end portion inserted in the through hole 9 defined in the electronic component packaging board 7 and having an outside diameter greater than the outside diameter of a portion of the tubular sleeve 10 which houses a contact 11 therein. The portion of the tubular sleeve 10 which houses the contact 11 therein projects largely from the electronic component packaging board 7.

The electronic component packaging board 7 shown in FIGS. 2(a) through 2(c) suffers the following disadvantages:

If each of the small-size sockets 8 for holding the device socket 2 detachably is of the structure shown in FIG. 2(b), then the spacing between the small-size sockets 8 on the electronic component packaging board 7 cannot be reduced because of required distances to be kept between adjacent ones of the through holes. Reducing the spacing between the small-size sockets 8 requires the diameter of the sleeve 10 to be reduced, but there is a certain limitation on the reduction of the diameter of the external leads 3 which are inserted in the sleeves 10. The structure shown in FIG. 2(b), therefore, does not permit the external leads of an electronic component for use on the device socket 2 to be reduced in pitch.

On the other hand, if each of the small-size sockets 8 for holding the device socket 2 replaceably is of the structure shown in FIG. 2(c), then it is possible to reduce the diameter of the through holes for inserting the small-size sockets 8 therein. The reduced diameter of the through holes allows the adjacent small-size sockets 8 to be positioned closely to each other, so that the small-size sockets 8 can be spaced closely on the electronic component packaging board 7. However, since the portion of the tubular sleeve 10 which houses the contact 11 therein projects largely from the electronic component packaging board 7, the distance over which the external leads 3 of the device socket 2 are electrically connected to the through holes in the electronic component packaging board 7 is large.

SUMMARY OF THE INVENTION

It is therefore an object of the present invention to provide an electronic component packaging board which allows an electric component mounted thereon to be replaced easily, permits external leads of an electric component to be spaced a reduced pitch, and can be electrically connected to an electric component over a short distance.

Another object of the present invention is to provide a pin connector for use in such an electronic component packaging board.

Still another object of the present invention is to provide a pin connector holder for holding such a pin connector highly accurately in position.

According to a first aspect of the present invention, there is provided a pin connector comprising a metallic slender sleeve, an outer contact bent outwardly from at least a portion of a side wall of the metallic slender sleeve, and an inner contact bent inwardly from at least a portion of a side wall of the metallic slender sleeve, the outer contact and the inner contact being resilient radially of the metallic slender sleeve. The metallic slender sleeve may have a contact region including the outer contact and the inner contact, a lead extending from the contact region, and a sealed portion disposed between the contact region and the lead.

According to a second aspect of the present invention, there is also provided a pin connector holder for holding a plurality of pin connectors each according to the first aspect of the present invention, having a plurality of through holes for being electrically connected to the outer contacts of the pin connectors, the through holes being positioned to keep the pin connectors spaced at a relatively small pitch.

The pin connectors may be inserted and held in the through holes and have end portions projecting from the through holes and fixed in position by a viscous adhesive.

The pin connector holder may further comprise a fixing member having a plurality of holes which receive the end portions projecting from the through holes, the end portions being fixed to the fixing member in the holes therein. It is preferable to employ a positioning structure by which the end portions projecting from the through holes and the holes in the fixing member are positioned with respect to each other.

According to a third aspect of the present invention, there is further provided an electronic component packaging board for supporting a pin connector according to the first aspect of the invention, comprising a board having a through hole defined therein in alignment with an external lead of an electronic component, the pin connector being inserted and held in the through hole. The pin connector may have an end portion projecting from the through hole and fixed to a land of the through hole.

The electronic component packaging board may further comprise another board disposed in confronting relation to the board and having a hole defined therein, the end portion projecting from the through hole being fixed to the other board in the hole.

The electronic component packaging board may further comprise a pin mounted on the other board for positioning the pin connector inserted in the through hole with respect to the hole in the other board, the board having a hole in which the pin is fitted.

The electronic component may comprise a device socket for supporting a semiconductor device detachably.

As described above, the pin connector according to the present invention has an outer contact bent outwardly from at least a portion of a side wall of a metallic slender sleeve and an inner contact bent inwardly from at least a portion of a side wall of the metallic slender sleeve. The outer contact and the inner contact are resilient radially of the metallic slender sleeve. The electronic component packaging board according to the present invention has a through hole defined therein in alignment with an external lead of an electronic component, and the pin connector is inserted and held in the through hole.

The electronic component packaging board thus constructed allows an electronic component such as a device socket to be easily replaced. Because the through hole in the electronic component packaging board is used as a socket for the pin connector, the pitch of external leads of the electronic component may be reduced, and the external lead may be electrically connected to the through hole over a short distance.

The pin connector which comprises a slender sleeve is formed by rounding a flat sheet, and hence has a gap along its seam. If the pin connector were soldered to the through hole, then the solder would be introduced through the gap into the pin connector, preventing the pin connector from receiving the external lead. To solve such a problem, the end portion of the pin connector which projects from the through hole in the board is inserted in a hole defined in a fixed member and soldered to the fixing member in the hole. Alternatively, the pin connector may be fixed directly to the board by a highly viscous adhesive rather than solder. When the end portion of the pin connector is fixed to the fixing member, a positioning structure such as a pin may be used to position the end portion of the pin connector easily with respect to the hole in the fixing member.

The above and other objects, features, and advantages of the present invention will become apparent from the following description with references to the accompanying drawings which illustrate examples of the present invention.

DETAILED DESCRIPTION OF THE PREFERRED EMBODIMENTS

Figure 3:
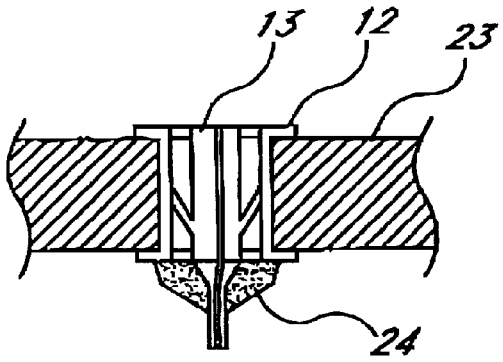
FIG. 3 is an enlarged fragmentary cross-sectional view of an electronic component packaging board according to an embodiment of the present invention.

As shown in FIG. 3, an electronic component packaging board according to an embodiment of the present invention comprises a printed wiring board 23 having patterns of interconnections connected to a device testing apparatus (not shown). The printed wiring board 23 has a plurality of through holes 12 (only one shown) each coated with a metal layer. A pin connector 13 is force-fitted and held in each of the through holes 12. The through holes 12 are positionally aligned with external leads of a device socket which is similar to the device socket 2 shown in FIG. 1.

As shown in FIG. 3, the pin connector 13 held in the through hole 12 has an end portion projecting from a reverse side of the printed wiring board 23, i.e., a lower side thereof in FIG. 3, and fixed to a land of the metal layer of the through hole 12 by a highly viscous adhesive 24. Since the forced-fitted pin connector 13 is fixed to the land of the through hole 12, the pin connector 13 is positioned highly accurately on the printed wiring board 23.

Figure 4A:
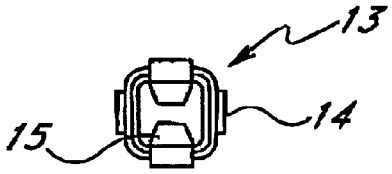
FIG. 4(a) is a plan view of a pin connector in the electronic component packaging board shown in FIG. 3.
Figure 4B:
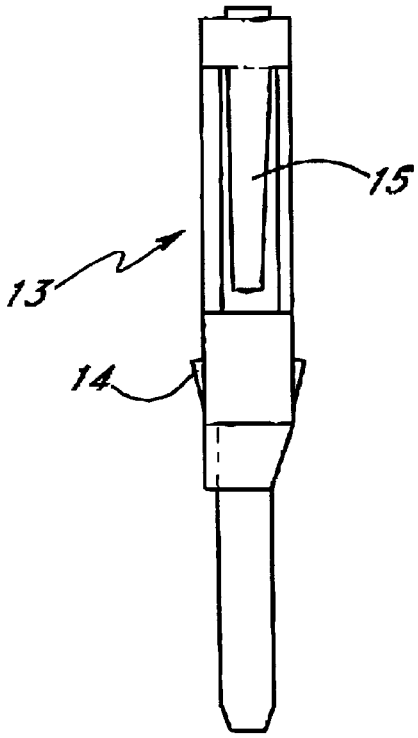
FIG. 4(b) is a front vertical view of the pin connector.
Figure 4C:
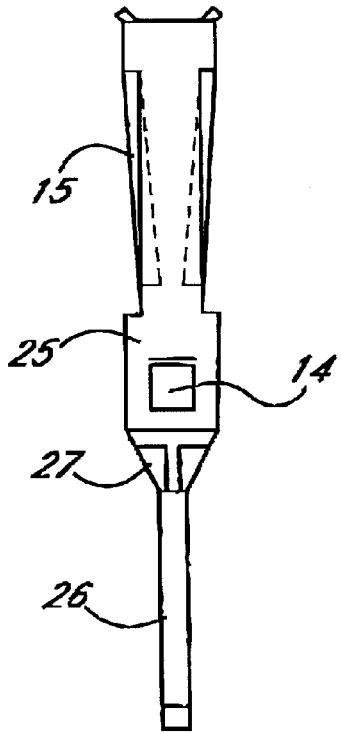
FIG. 4(c) is a side vertical view of the pin connector.

The pin connector 13 comprises a slender sleeve which is formed by rounding a flat springy sheet made of an alloy of beryllium (Be) and copper (Cu) and plated with gold (Au). As shown in FIGS. 4(a) through 4(c), the pin connector 13 has a pair of outer contacts 14 which are bent outwardly from opposite sides walls of the slender sleeve thereof, and a pair of inner contacts 15 which are bent inwardly from opposite side walls of the slender sleeve thereof. The outer contacts 14 and the inner contacts 15 exert resilient forces radially of the slender sleeve. As shown in FIG. 3, a contact region 25 (see FIG. 4(c)) of the pin connector 13, which comprises the outer contacts 14 and the inner contacts 15, is housed in the through hole 12, and the remaining end portion of the pin connector 13 projects as a lead 26 (see FIG. 4(c)) from the through hole 12.

Figure 1:
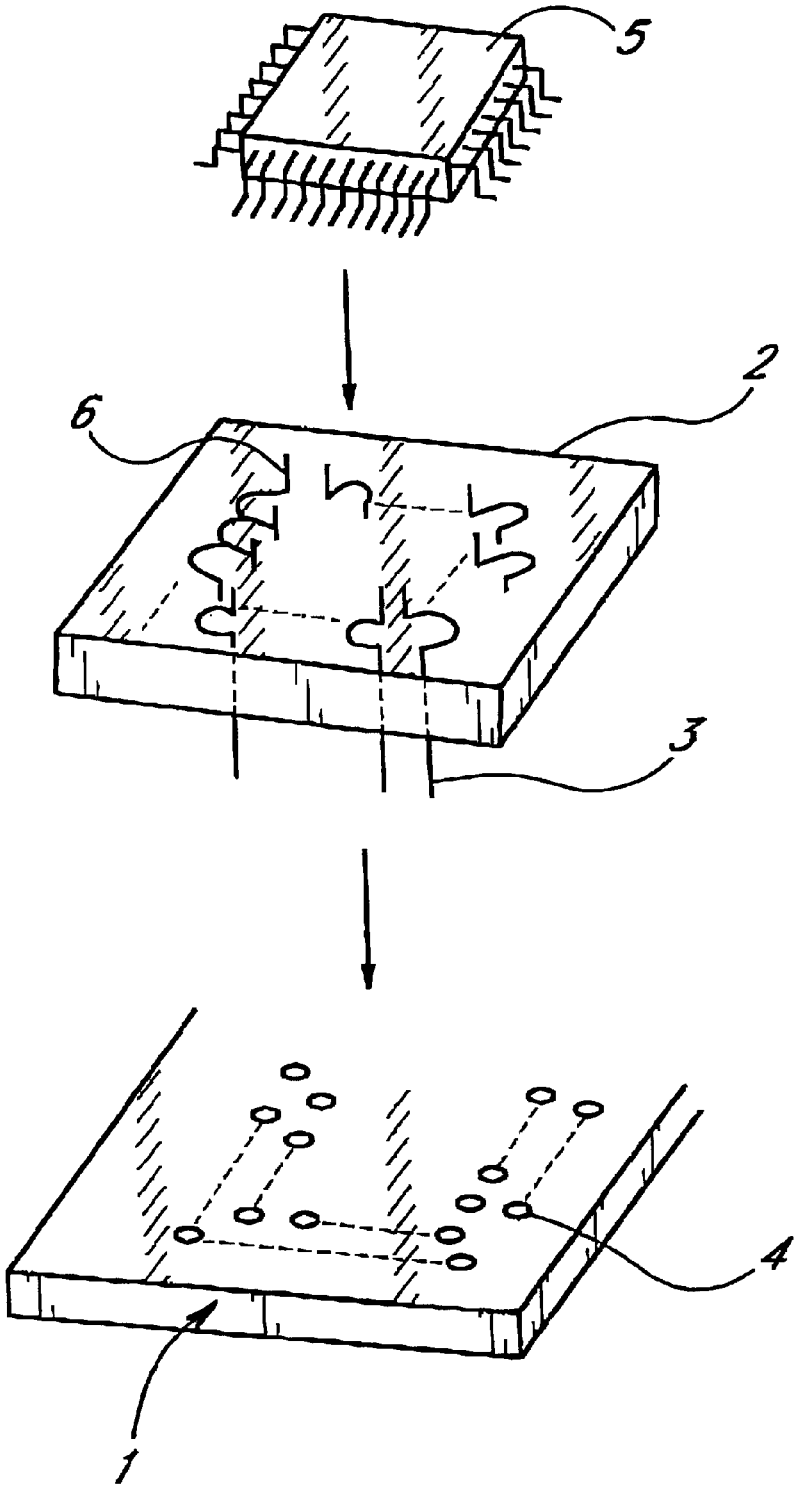
FIG. 1 (PRIOR ART)
FIG. 1 is an exploded perspective view showing the manner in which an electronic component is soldered to a conventional packaging board.
Figure 2A:
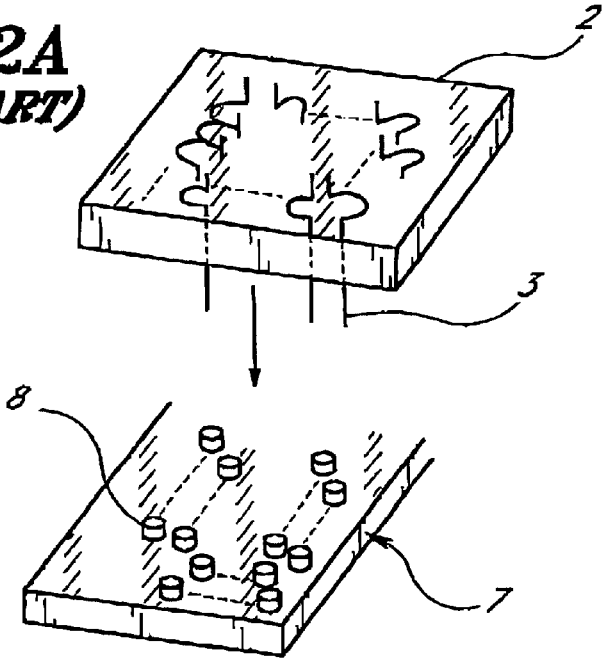
FIG. 2A (PRIOR ART)
FIG. 2(a) is an exploded perspective view the manner in which an electronic component is detachably mounted on another conventional electronic component packaging board.
Figure 2B:
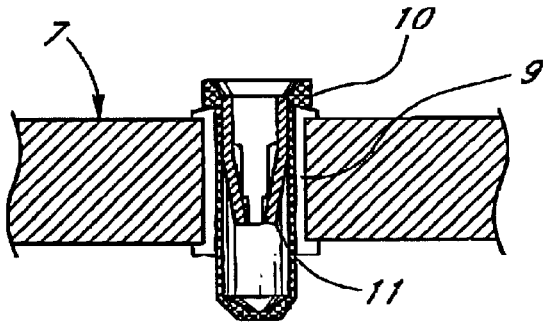
FIG. 2B (PRIOR ART)
FIG. 2(b) is an enlarged fragmentary cross-sectional view of a small-size socket on the conventional electronic component packaging board shown in FIG. 2(a)
Figure 2C:
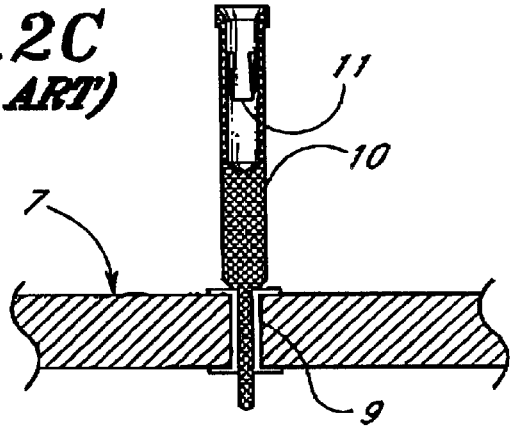
FIG. 2C (PRIOR ART)
FIG. 2(c) is an enlarged fragmentary cross-sectional view of another small-size socket which may be used on the conventional electronic component packaging board shown in FIG. 2(a)

When an external lead, similar to the external lead 3 shown in FIG. 1, is inserted into the pin connector 13, the external lead is resiliently gripped in the pin connector 13 by the inner contacts 15. When the pin connector 13 is inserted into the through hole 12 in the printed wiring board 23, the outer contacts 14 are electrically connected to the through hole 12 over a short distance. Because the outer contacts 14 are resilient, they resiliently keep the pin connector 13 in the through hole 12. Inasmuch as the through hole 12 is used as a socket for the pin connector 13, it allows the external leads of the electronic component to be spaced a reduced pitch.

The pin connector 13, which is produced by rounding the flat springy sheet into the slender sleeve, has a gap along its seam. Because of the gap, the pin connector 13 is fixed to the through hole 12 by the highly viscous adhesive 24. Specifically, if the pin connector 13 were soldered to the through hole 12, then the solder would find its way into the pin connector 13 through the gap, preventing an external lead from entering the pin connector 13.

To permit the pin connector 13 to be soldered to he through hole 12, the pin connector 13 may have a sealed portion 27 (see FIG. 4(c)) disposed between the contact region 25 and the lead 26. The sealed portion 27 serves to prevent solder or flux or both from entering the pin connector 13. The sealed portion 27 may comprise a filled mass of silicone.

The printed wiring board 23 serves as a pin connector holder for holding the pin connector 13. According to the present invention, such a pin connector holder is not limited to the printed wiring board, but may be of any of various structures insofar as they have the through hole 12.

Figure 5:
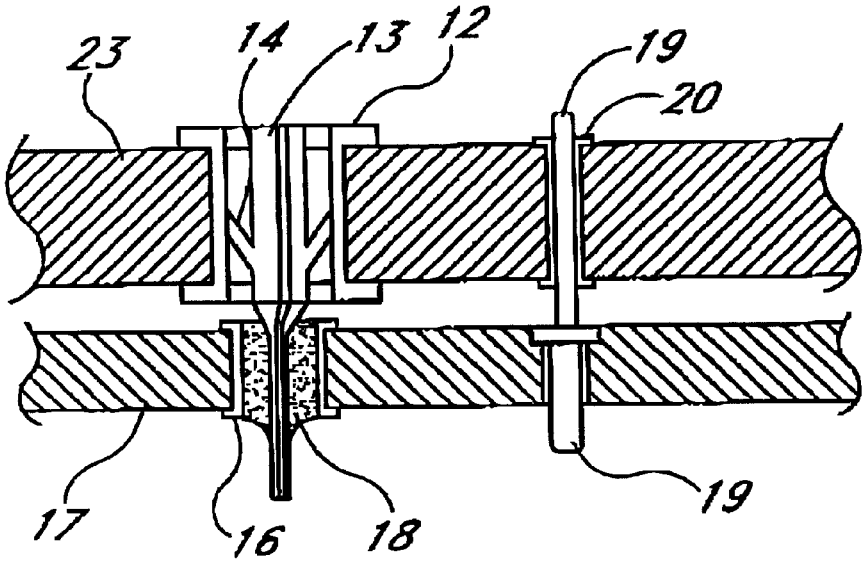
FIG. 5 is an enlarged fragmentary cross-sectional view of an electronic component packaging board according to another embodiment of the present invention.
Figure 6:
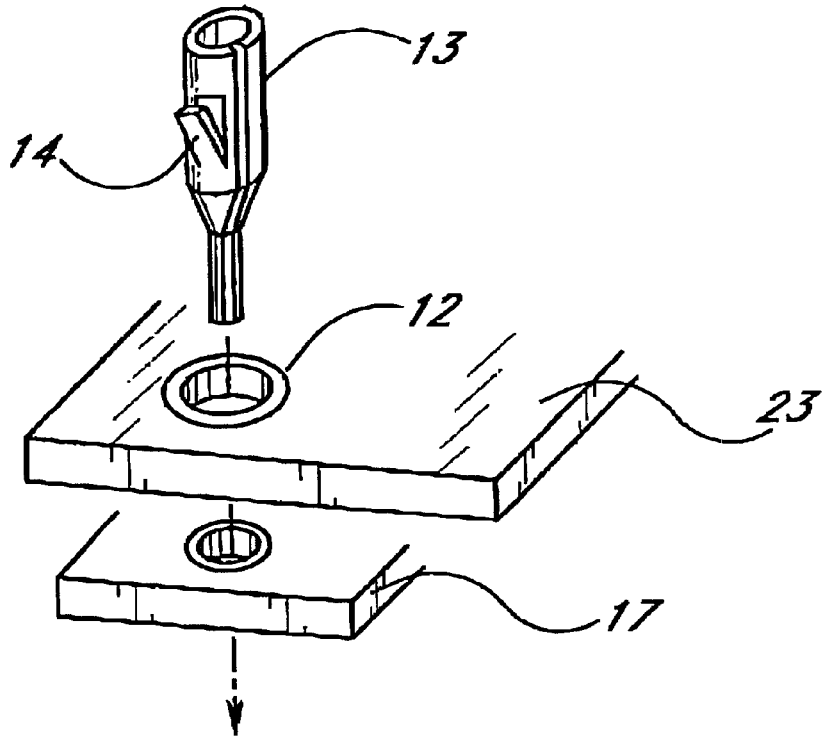
FIG. 6 is a fragmentary perspective view of parts which make up the electronic component packaging board shown in FIG. 5.

FIGS. 5 and 6 shows an electronic component packaging board according to another embodiment of the present invention.

The electronic component packaging board shown in FIGS. 5 and 6 comprise a printed wiring board 23 having a plurality of through holes 12 (only one shown) in each of which a pin connector 13 is inserted and held. The pin connector 13 is fixed in position by a structure which is different from the structure according to the embodiment shown in FIGS. 3 and 4(a) through 4(c). As shown in FIG. 5, another printed wiring board 17 having a plurality of through holes 16 (only one shown) is positioned on and spaced from the reverse side of the printed wiring board 23. An end portion of the pin connector 13 which projects from the reverse side of the printed wiring board 23 is fixed to the corresponding one of the through holes 16 by solder 18. The projecting end portion of the pin connector 13 may instead be fixed to the through hole 16 by a highly viscous adhesive. The projecting end portion of the pin connector 13 may instead fixed to any of various members rather than the printed wiring board 17 insofar as the member used has a hole in which the projecting end portion of the pin connector 13 can be inserted. The printed wiring boards 23, 17 may or may not be spaced from each other.

The electronic component packaging board shown in FIGS. 5 and 6 has a positioning structure for positioning the pin connector 13 on the printed wiring board 23 with respect to the through hole 16 in the printed wiring board 17. The positioning structure includes a pin 19 mounted on the printed wiring board 17 and a through hole 20 or a hole defined in the printed wiring board 23 for inserting the pin 19 therein.

As described above, the pin connector according to the present invention has an outer contact bent outwardly from at least a portion of a side wall of a metallic slender sleeve and an inner contact bent inwardly from at least a portion of a side wall of the metallic slender sleeve. The electronic component packaging board according to the present invention has a through hole defined therein in alignment with an external lead of an electronic component, and the pin connector is inserted and held in the through hole.

Since an external lead of an electronic component such as a device socket can be inserted into an removed from the pin connector, the electronic component can easily be replaced. Because the through hole in the electronic component packaging board is used as a socket for the pin connector, the pitch of external leads of the electronic component may be reduced, and the external lead may be electrically connected to the through hole over a short distance.

The pin connector is positioned highly accurately on the electronic component packaging board when the pin connector held in the through hole is fixed in position. The pin connector is fixed to a fixing member having a hole in which an end portion of the pin connector is inserted. The end portion of the pin connector which projects from the through hole is inserted in and fixed to a hole defined in the fixing member. In the case where the pin connector has a gap along a seam thereof, if the pin connector were soldered to the through hole, then the solder would be introduced through the gap into the pin connector, preventing the pin connector from receiving the external lead. However, no such problem arises when the end portion of the pin connector is fixed to the fixing member. Therefore, the electronic component packaging board can be manufactured with a high yield.

When the end portion of the pin connector is fixed to the fixing member, a positioning structure such as a pin may be used to position the end portion of the pin connector easily with respect to the hole in the fixing member.

While preferred embodiments of the present invention have been described using specific terms, such description is for illustrative purposes only, and it is to be understood that changes and variations may be made without departing from the spirit or scope of the following claims.

What is claimed is:

1. A pin connector comprising a slender sleeve formed of electrically conductive material, the slender sleeve comprising a contact region, a lead portion, and a sealed portion, the contact region including an outer contact bent outwardly from at least a portion of a side wall of the slender sleeve and an inner contact bent inwardly from at least a portion of a side wall of the slender sleeve, the outer contact and the inner contact being formed of electrically conductive material and electrically connected to the slender sleeve, the lead portion including a longitudinal seam defining a gap along the seam, the sealed portion being located between the lead portion and the contact region.

2. A pin connector for holding a plurality of pin connectors as defined in claim 1, the pin connector holder comprising a plurality of through holes, wherein each of the through holes receives each pin connector so that the outer contact of the pin connector electrically connects the through holes, the through holes being positioned to keep the pin connectors spaced at a relatively small pitch.

3. A pin connector holder as defined in claim 2, wherein each pin connector is inserted through each of the through holes with the lead portion projecting from the through hole, and wherein the lead portion of the pin connector is fixed in position with a viscous adhesive.

4. A pin connector holder as defined in claim 2, further comprising a fixing member having a plurality of holes, wherein each of holes of the fixing member is correspondingly located below each of the through holes, wherein each pin connector is inserted through each of the through holes with the lead portion projecting from the through hole, wherein the correspondingly below-located hole of the fixing member receives the lead portion projecting form the through hole to fix to the fixing member.

5. A pin connector holder as defined in claim 4, further comprising a positioning structure positioning the holes of the fixing member with respect to the corresponding through holes so that the lead portion projecting from each through hole is inserted into the correspondingly below located hole of the fixing member.

6. An electronic component packaging board for supporting a plurality of pin connectors as defined in claim 1, the packaging board comprising a board having a plurality of through holes, each of the through holes being in alignment with an external lead of an electronic component to be electrically connected to the board, wherein each of the pin connectors is received by and electrically connected to each of the through holes.

7. An electronic component packaging board as defined in claim 6, wherein each pin connector is inserted through each of the through holes with the lead portion projecting from the through hole, and wherein the lead portion of the pin connector is fixed to a land of the through hole of the board.

8. An electronic component packaging board as defined in claim 6, wherein the packaging board comprises a first board, and the through holes therein comprises first holes, wherein the packaging board further comprises a second board disposed in parallel with respect to the first board, and the second board having a plurality of second holes, each of which corresponds in position to each of the first holes, wherein each pin connector is inserted through each of the first holes with the lead portion projecting from the first hole, and wherein the second hole receives the lead portion projection from the first hole to fix to the second board.

9. An electronic component packaging board as defined in claim 8, further comprising a pin for positioning the relative location of the first and second holes so that the lead portion projecting from the first hole of the first board is inserted into the correspondingly located second hole of the second board.

10. An electronic component packaging board as defined in any one of claims 6, wherein the electronic component to be electrically connected to the board comprises a device socket detachably supporting a semiconductor device.

* * * * *